(12) United States Patent
Staude et al.

(10) Patent No.: US 11,433,802 B2
(45) Date of Patent: Sep. 6, 2022

(54) SWITCH WITH REVERSING LEVER AND LARGE SWITCHING PATH

(71) Applicant: Valeo Schalter und Sensoren GmbH, Bietigheim-Bissingen (DE)

(72) Inventors: Sascha Staude, Bietigheim-Bissingen (DE); Daniela Pikart, Bietigheim-Bissingen (DE)

(73) Assignee: Valeo Schalter und Sensoren GmbH, Bietigheim-Bissingen (DE)

( * ) Notice: Subject to any disclaimer, the term of this patent is extended or adjusted under 35 U.S.C. 154(b) by 286 days.

(21) Appl. No.: 16/615,526

(22) PCT Filed: Apr. 26, 2018

(86) PCT No.: PCT/EP2018/060651
§ 371 (c)(1),
(2) Date: Nov. 21, 2019

(87) PCT Pub. No.: WO2018/215157
PCT Pub. Date: Nov. 29, 2018

(65) Prior Publication Data
US 2020/0180499 A1    Jun. 11, 2020

(30) Foreign Application Priority Data
May 22, 2017  (DE) ..................... 10 2017 111 052.6

(51) Int. Cl.
*B60Q 1/00*   (2006.01)
*B62D 1/16*   (2006.01)
*H03K 17/97*  (2006.01)

(52) U.S. Cl.
CPC ............. *B60Q 1/0076* (2013.01); *B62D 1/16* (2013.01); *H03K 17/97* (2013.01)

(58) Field of Classification Search
None
See application file for complete search history.

(56) References Cited

U.S. PATENT DOCUMENTS

2015/0035669 A1*  2/2015  Scheck .................... B60Q 1/34
340/476

FOREIGN PATENT DOCUMENTS

DE     4238070 A1    5/1993
DE   199 22 500 A1  11/2000
(Continued)

OTHER PUBLICATIONS

International Search Report and Written Opinion in corresponding International Application No. PCT/EP2018/060651, dated Jul. 19, 2018 (12 pages).

*Primary Examiner* — Daniel C Puentes
(74) *Attorney, Agent, or Firm* — Osha Bergman Watanabe & Burton LLP

(57) ABSTRACT

The invention relates to a switch (10), in particular as a steering column switch for arrangement on a steering column of a vehicle, with an actuable switch lever (12) which has along its longitudinal axis (14) a bearing element (16) with which the switch lever (12) is mounted movably in a bearing (20) of a base housing (18), a switching element (30) which is movement-coupled to the switch lever (12) and which is embodied with a contact-free signalling element (32), wherein the switch lever (12) can be activated on a first side (34) of the bearing element (16), the switching element (30) is arranged on a second side (36) of the bearing element (16), the switching element (30) is embodied as a reversing lever with a first and a second lever arm (40, 42), the reversing lever (30) is retained in the connection region (44) of the first and second lever arm (40, 42) in a reversing bearing (46) rotatably on the base housing (18), the signalling element (32) is arranged on the first lever arm (40), and the second lever arm (42) is coupled to the switch lever (12). The invention furthermore relates to a vehicle with an above switch (10).

9 Claims, 2 Drawing Sheets

(56) References Cited

FOREIGN PATENT DOCUMENTS

Figure 1:
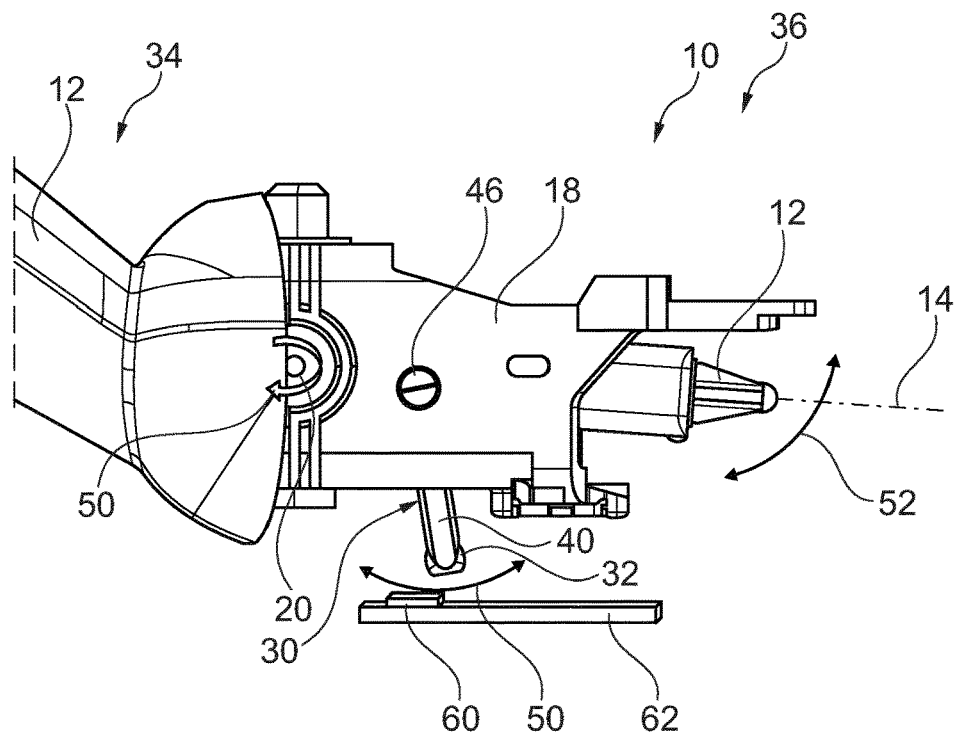

| | | | |
|---|---|---|---|
| DE | 69702600 T2 | 3/2001 | |
| DE | 10 2005 018 289 A1 | 11/2006 | |
| DE | 10 2014 011501 A1 | 2/2016 | |
| JP | 2015-176652 A | 10/2015 | |
| JP | 2015-216038 A | 12/2015 | |
| JP | 2017-016920 A | 1/2017 | |
| JP | 2017016920 A * | 1/2017 | ........... B60Q 1/1469 |

* cited by examiner

SWITCH WITH REVERSING LEVER AND LARGE SWITCHING PATH

The present invention relates to a switch, in particular as a steering column switch for arrangement on a steering column of a vehicle, with an actuable switch lever which has along its longitudinal axis a bearing element with which the switch lever is mounted movably in a bearing of a base housing, a switching element which is movement-coupled to the switch lever and which is embodied with a contact-free signalling element, wherein the switch lever can be activated on a first side of the bearing element, the switching element is arranged on a second side of the bearing element.

The present invention furthermore relates to a vehicle with an above switch.

The term steering column switch refers to switches provided with a switch lever which are fitted on the steering column of a vehicle between dashboard and steering wheel. Steering column switches can, in modern vehicles, be connected directly to a control device on the steering column which can convert various states at the switch lever directly into corresponding switching signals. The switching signals can be further transmitted, for example, via a vehicle bus. CAN, LIN or Flexray are known, for example, as bus systems.

Fundamental applications for steering column switches are direction indicators, also referred to as indicators, vehicle lighting comprising dipped headlights, high beams and, where applicable, flashers, as well as windscreen wiper and washer control.

Steering column switches are furthermore known as operating elements for automatic speed control, also referred to as cruise control, or remote control of car radios.

Several functions can be realized with each switch lever, which functions can be triggered by tangential movement with latching and tilting function, such as, for example, in the case of direction indicators, by pulling against a resistance for the flasher or pushing with a latch for the high beam.

Such switches with magnetic activation are also known in principle. A switching element is attached to the inside of the switch lever, which switching element extends radially from the switch lever and at the tip of which a magnetic signalling element is attached. The position of the signalling element is detected by a magnetic sensor. It is disadvantageous in these switches, however, that a differentiation between various switch positions is directly dependent on the movement of the switching element, the movement of which is in turn directly dependent on the movement of the switch lever so that a great length of the switching element is necessary for reliable differentiation between the switch positions, which in turn requires a large installation space.

In this context, DE 199 22 500 A1 discloses a switch device, in particular for motor vehicles, in the case of which an activation of the activation element is detected in a contact-free manner and the switch device is formed as a module.

DE 10 2005 018 289 A1 furthermore discloses a switch, in particular steering column switch for arrangement on a steering column of a vehicle, with an actuable switch lever, with a switching element movement-coupled to the switch lever, wherein one switching element is pivotable about at least two axes arranged transversely to one another and in the region of its surface has differently polarized magnetic portions, and with an electronics unit having magnetic field sensors, wherein the respective switch position of one switching element can be detected via the magnetic field sensors and a corresponding switching process can be initiated and wherein a wall is arranged between one switching element and the magnetic field sensors, through which wall the magnetic field proceeding from the switching element penetrates.

Proceeding from the above-mentioned prior art, the object on which the invention is based is thus to indicate a switch of the above-mentioned type and a vehicle with such a switch which enable simple differentiation and only require a small installation space.

The object is achieved according to the invention by the features of the independent claims. Advantageous configurations of the invention are indicated in the subordinate claims.

According to the invention, a switch is thus indicated, in particular as a steering column switch for arrangement on a steering column of a vehicle, with an actuable switch lever which has along its longitudinal axis a bearing element with which the switch lever is mounted movably in a bearing of a base housing, a switching element which is movement-coupled to the switch lever and which is embodied with a contact-free signalling element, wherein the switch lever can be activated on a first side of the bearing element, the switching element is arranged on a second side of the bearing element, the switching element is embodied as a reversing lever with a first and a second lever arm, the reversing lever is retained in the connection region of the first and second lever arm in a reversing bearing rotatably on the base housing, the signalling element is arranged on the first lever arm, and the second lever arm is coupled to the switch lever.

A vehicle with an above switch is furthermore indicated according to the invention.

The fundamental idea of the present invention is therefore to uncouple the movement of the switch lever from the movement of the signalling element by means of the configuration of the switching element as a reversing lever. As a result, the switch can be embodied with a small installation space since the movement of the signalling element can be performed as desired as a result of the configuration of the reversing lever.

The switch lever can be embodied as a simple straight lever. It is nevertheless also possible that the switch lever can have any desired different form. Portions of the switch lever can also be arranged on the first side and the second side not in a line, but rather with an angle offset in fundamentally any desired direction.

The bearing element is embodied to be dependent on degrees of freedom of the movement of the switch lever, for example, for movable bearing about one or two axes of the switch lever.

The coupling of the switching element to the switch lever is embodied such that a movement of the switch lever on its second side brings about a movement of the reversing lever, with the resultant movement of the signalling element.

The bearing element can also be retained in the base housing. The base housing provides a structure on which components of the switch can be attached in a stationary manner.

The switching element can be embodied with the first and a second lever arm in such a manner that the first and the second lever arm can have in principle any desired angle to one another. The first and the second lever arm are preferably arranged in such a manner that they enclose an angle of approximately 90° between them.

In one advantageous configuration of the invention, the switch lever is pivotable about an axis and the reversing lever converts the movement of the switch lever in one axis into a corresponding movement of the switching element in an axis. Both the bearing element and the reversing bearing can thus also be configured to be simple since they only respectively have to support a simple pivoting.

In one advantageous configuration of the invention, the switch lever is pivotable about two axes arranged transversely to one another, and the reversing lever converts the movement of the switch lever in the two axes into a movement of the switching element in two axes. This enables the realization of several switching functions with only one switch. A two-dimensional switching function can alternatively be realized with the switch.

In one advantageous configuration of the invention, the second lever arm has a smaller length than the first lever arm. As a result of the smaller length of the second lever arm, an in principle smaller movement of the switch lever can be converted into a larger movement of the signalling element, as a result of which the switching path can be increased. As a result, various positions of the switch lever can be easily detected with conventional sensors. The length of the respective lever arm relates to an effective lever length, i.e. a length from the reversing lever to the signalling element or to a position of the coupling to the switch lever.

In one advantageous configuration of the invention, the second lever arm has a longitudinal guide with which the second lever arm is coupled to the switch lever displaceably in the direction of the longitudinal axis of the switch lever. Good mobility of the switching element is achieved with the longitudinal guide, which is advantageous in particular for a movement about several axes. A movable coupling between the second lever arm and the switch lever is formed.

In one advantageous configuration of the invention, the switching element and the bearing element are arranged on the switch lever axially offset in the direction of the longitudinal axis of the switch lever. The arrangement of the switching element on the switch lever is therefore separate from the bearing in the bearing element. As a result, the movement of the switching element and in particular of the signalling element can be configured freely. In particular, as a result of a different lever length of the switch lever, deflections of the switch lever can be reproduced in an amplified manner by the signalling element in order to improve a resolution of the switch or to be able to exactly define a response of the switch. The movement of the signalling element can be configured freely in particular as a result of the combination with the switching element embodied as a reversing lever.

In one advantageous configuration of the invention, the switching element is embodied and arranged in such a manner that the second lever arm extends substantially in the direction of the bearing element and is coupled to the switch lever between the bearing element and the reversing bearing. As a result, even a small absolute movement of the switch lever can be converted into a corresponding large movement of the signalling element. The switch lever can be embodied with a small extension in the longitudinal direction, as a result of which the switch overall can have a small installation size. In one alternative embodiment, the switching element can be embodied and arranged in such a manner that the second lever arm extends substantially in the direction away from the bearing element. The second lever arm is, proceeding from the reversing bearing on the side of the switch lever opposite the bearing element, correspondingly coupled to the switch lever.

In one advantageous configuration of the invention, the signalling element is a magnetic signalling element, and the switch has a magnetic sensor in order to detect the movement of the signalling element. The magnetic sensor is embodied in accordance with the mobility of the signalling element. The magnetic sensor is preferably mounted on the housing.

In one advantageous configuration of the invention, the magnetic sensor is a 3D magnetic sensor or a magnetic sensor field. This is advantageous in order to be able to detect a movement of the switch lever about more than one axis reliably by the corresponding movement of the signalling element.

The invention is explained by way of example below with reference to the enclosed drawing using preferred exemplary embodiments, wherein the features represented below can represent one aspect of the invention both in each case individually or in combination.

In the drawing

Figure 2:
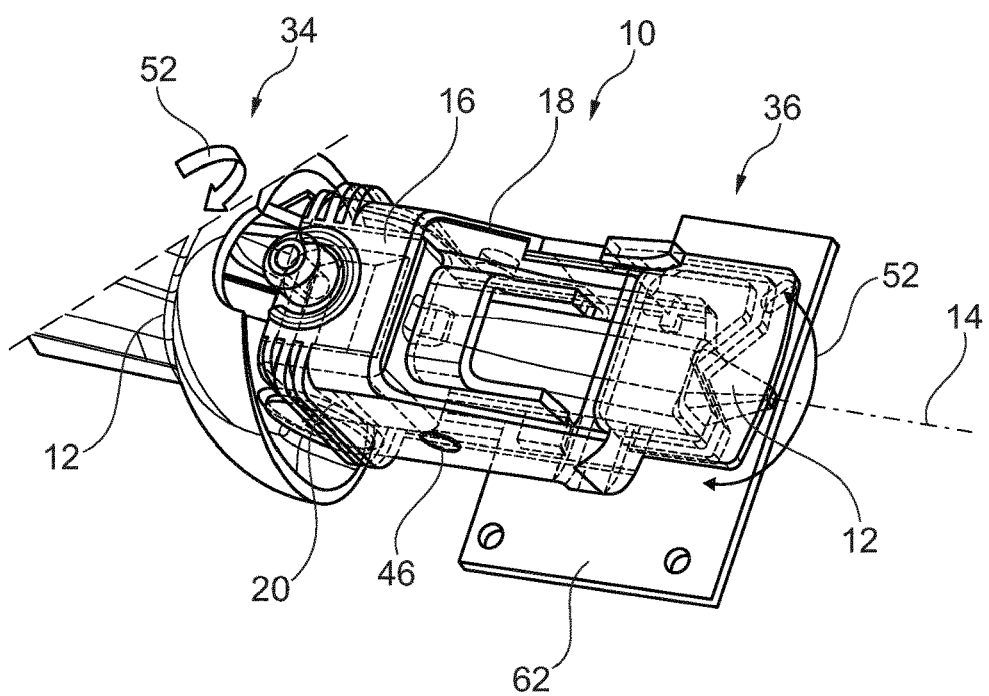
Figure 3:
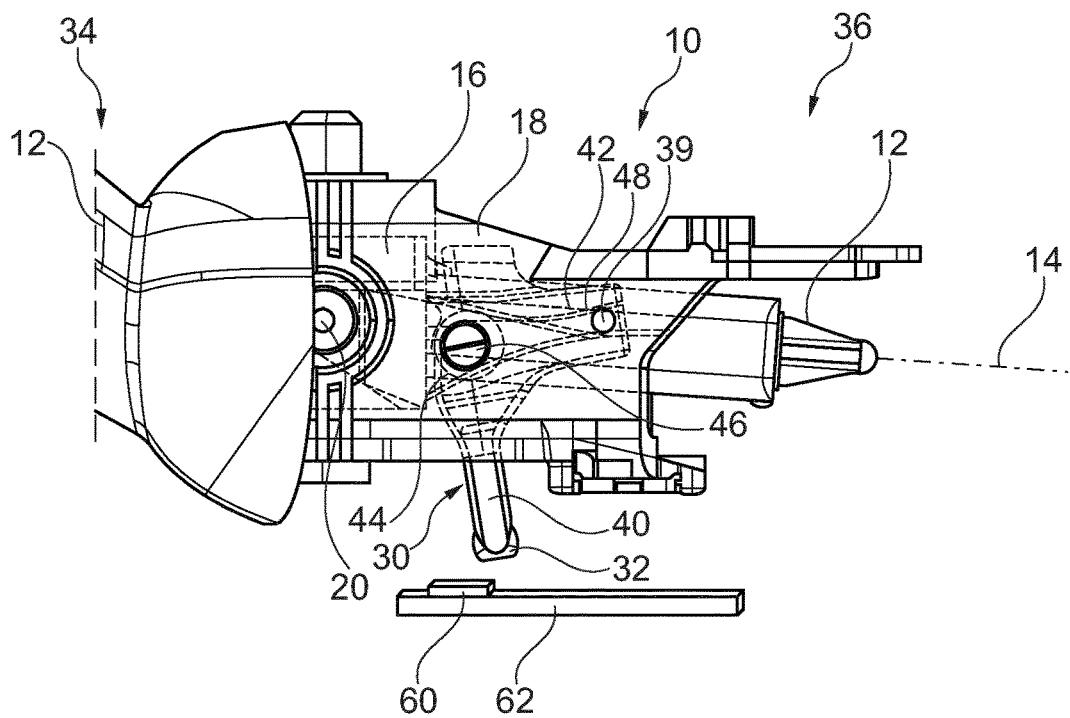
Figure 4:
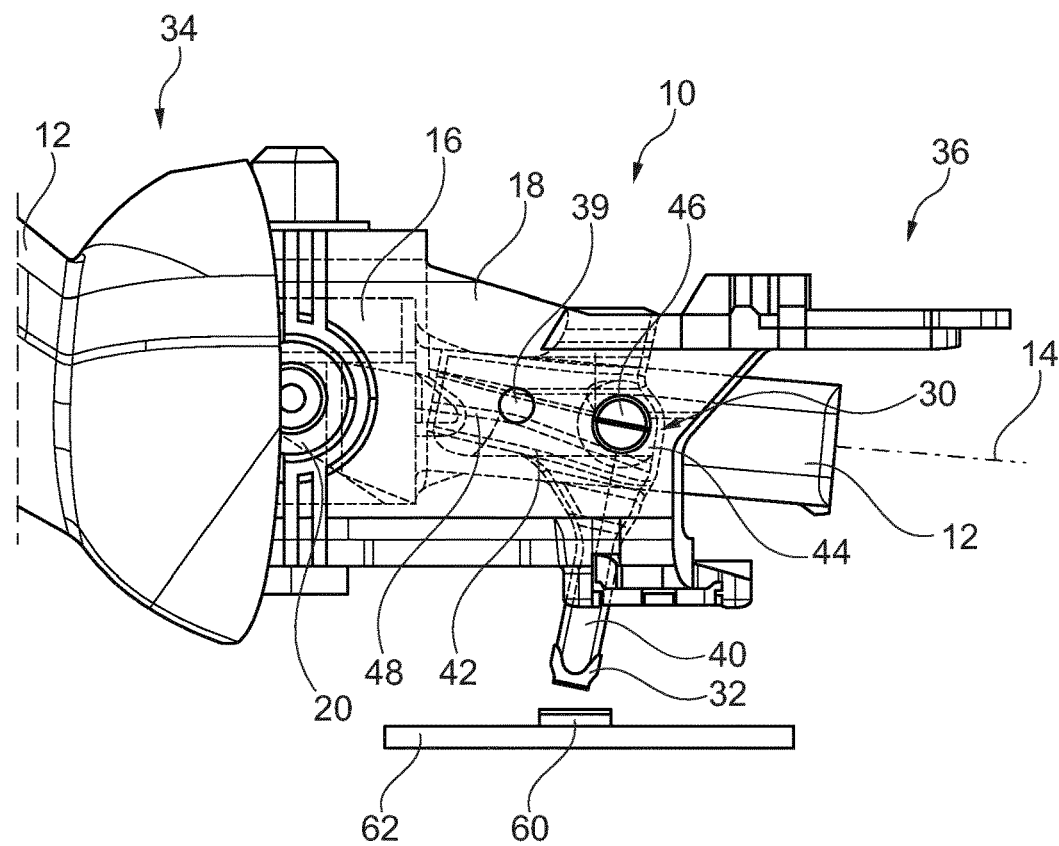

FIG. 1 shows a side view of a switch which is embodied as a steering column switch, with a switch lever, a housing, a switching element with a contact-free signalling element and a magnetic sensor arranged on a circuit board according to a first preferred embodiment, FIG. 2 shows a top view of the switch from FIG. 1 in a partially transparent representation, FIG. 3 shows the side view from FIG. 1 in a partially transparent representation with a fully visible switching element and its coupling to the switch lever, and FIG. 4 shows a side view of a switch according to a second embodiment in a partially transparent representation with a fully visible switching element and its coupling to the switch lever, wherein the switching element is arranged rotated in the axial direction of the switch lever.

FIGS. 1 to 3 show a switch 10 embodied as a steering column switch according to a first preferred embodiment of the invention. Switch 10 is correspondingly embodied for arrangement on a steering column, not shown, of a vehicle, also not represented.

Switch 10 comprises an actuable switch lever 12 which has, along its longitudinal axis 14, a bearing element 16 with which switch lever 12 is mounted movably in a bearing of a base housing 18. Bearing element 16 is retained in base housing 18.

Switch lever 12 is embodied on its first and second side 34, 36 with an angle offset. First side 34 relates, as seen from bearing element 16, to that side of switch lever 12 on which switch lever 12 can be activated. Second side 36 relates to the correspondingly other side of switch lever 12. Switch lever 12 is pivotable about two axes 50, 52 arranged transversely to one another. Bearing element 16 is correspondingly embodied in accordance with the degrees of freedom of the movement of switch lever 12 for movable bearing of switch lever 12 about two axes 50, 52.

Switch 10 additionally comprises a switching element 30 which is embodied as a reversing lever with a first and a second lever arm 40, 42. Switching element 30 is arranged on second side 36 of switch lever 12. Switching element 30 is arranged on switch lever 12 axially offset to bearing element 16 in the direction of the longitudinal axis 14 of switch lever 12, as a result of which the arrangement of the switching element 30 on switch lever 12 is separate from the bearing in bearing element 16. In one particularly preferred exemplary embodiment, the reversing bearing (46) of the switching element (30) and the bearing (20) of the bearing element (16) are arranged on the switch lever (12) axially offset to one another in the direction of the longitudinal axis (14) of the switch lever (12).

Switching element 30 is embodied in such a manner that first and second lever arm 40, 42 enclose an angle of approximately 90° between them. A contact-free signalling element 32 is arranged at a tip of first lever arm 40 and second lever arm 42 is movement-coupled to switch lever 12. The coupling of switching element 30 to switch lever 12 is embodied in such a manner that a movement of switch lever 12 on its second side 36 brings about a movement of switching element 30, with a resultant movement of signalling element 32.

Switching element 30 is retained in connection region 44 of first and second lever arm 40, 42 in a reversing bearing 46 rotatably on base housing 18. Switching element 30 converts the movement of switch lever 12 in the two axes 50, 52 into a movement of signalling element 32 in two axes 50, 52.

Signalling element 32 is a magnetic signalling element. Switch 10 correspondingly comprises a magnetic sensor in order to detect the movement of signalling element 32. Magnetic sensor 60 is embodied as a 3D magnetic sensor or magnetic sensor field and is mounted on base housing 18.

As is apparent from FIG. 3, second lever arm 42 has a longitudinal guide 48 with which second lever arm 42 is coupled to switch lever 12 displaceably in the direction of longitudinal axis 14 of switch lever 12. A coupling element 39 is formed on second side 36 of switch lever 12 which is guided in longitudinal guide 48 in order to couple second lever arm 42 via longitudinal guide 48 and coupling element 39 to second side 36 of switch lever 12.

Switching element 30 is embodied and arranged in such a manner that its second lever arm 42 extends substantially in the direction of bearing element 16. Switching element 30 is correspondingly coupled to switch lever 12 on second lever arm 42 between bearing element 16 and reversing bearing 46.

FIG. 4 shows a switch 10 according to a second embodiment of the invention. Switch 10 of the second embodiment is substantially identical to switch 10 of the first embodiment. Only differences of switch 10 of the second embodiment from switch 10 of the first embodiment are correspondingly described in detail. Details which are not described can be embodied as described with reference to the first embodiment.

According to the second embodiment, switching element 30 is embodied and arranged in such a manner that its second lever arm 42 extends substantially in the direction away from bearing element 16. Switching element 30 is coupled to switch lever 12 correspondingly on second lever arm 42, as seen from reversing bearing 46, on that side of switch lever 12 which is opposite bearing element 16.

LIST OF REFERENCE NUMBERS

Switch 10
Switch lever 12
Longitudinal axis 14
Bearing element 16
Base housing 18
Bearing 20
Switching element, reversing lever 30
Signalling element 32
First side 34
Second side 36
Coupling element 39
First lever arm 40
Second lever arm 42
Connection region 44
Reversing bearing 46
Longitudinal guide 48
First axis 50
Second axis 52
Magnetic sensor 60
Circuit board 62

The invention claimed is:

1. A switch as a steering column switch for arrangement on a steering column of a vehicle, comprising:
    an actuable switch lever which has along its longitudinal axis a bearing element with which the switch lever is mounted movably in a bearing of a base housing;
    a switching element which is movement-coupled to the switch lever and is embodied with a contact-free signalling element,
    wherein the switch lever is activated on a first side of the bearing element, and the switching element is arranged on a second side of the bearing element,
    wherein the switching element is embodied as a reversing lever with a first and a second lever arm, the reversing lever is retained in the connection region of the first and second lever arm in a reversing bearing rotatably on the base housing, the signalling element is arranged on the first lever arm, and the second lever arm is coupled to the switch lever,
    wherein the switch lever is pivotable along two transverse planes of movement, and the reversing lever converts the movement of the switch lever along the two transverse planes into a corresponding movement of the contact-free signalling element of the switching element, and
    wherein the contact-free signalling element comprises a magnetic signaling element that rotates due to a rotational movement of the first lever arm of the reversing lever.

2. The switch according to claim 1, wherein the second lever arm has a smaller length than the first lever arm.

3. The switch according to claim 1, wherein the second lever arm has a longitudinal guide with which the second lever arm is coupled to the switch lever displaceably in the direction of a longitudinal axis of the switch lever.

4. The switch according to claim 1, wherein the switching element and the bearing element are arranged on the switch lever axially offset in the direction of a longitudinal axis of the switch lever.

5. The switch according to claim 4, wherein the reversing bearing of the switching element and the bearing of the bearing element are arranged on the switch lever axially offset to one another in the direction of the longitudinal axis of the switch lever.

6. The switch according to claim 1, wherein the switching element is embodied and arranged in such a manner that the second lever arm extends substantially in the direction of the bearing element and is coupled to the switch lever between the bearing element and the reversing bearing.

7. The switch according to claim 1, wherein the signalling element is a magnetic signalling element, and the switch has a magnetic sensor in order to detect the movement of the signalling element.

8. The switch according to claim 1, wherein the magnetic sensor is a 3D magnetic sensor or a magnetic sensor field.

9. A motor vehicle with a switch according to claim 1.

* * * * *